(12) United States Patent
Chong et al.

(10) Patent No.: US 11,056,183 B2
(45) Date of Patent: Jul. 6, 2021

(54) MULTI-PORT MEMORY CIRCUITRY

(71) Applicant: Arm Limited, Cambridge (GB)

(72) Inventors: Yew Keong Chong, Austin, TX (US); Andy Wangkun Chen, Austin, TX (US); Sriram Thyagarajan, Austin, TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 15/961,862

(22) Filed: Apr. 24, 2018

(65) Prior Publication Data

US 2019/0325950 A1    Oct. 24, 2019

(51) Int. Cl.
*G11C 7/10* (2006.01)
*G11C 11/419* (2006.01)
*G11C 11/418* (2006.01)
*H01L 27/11* (2006.01)

(52) U.S. Cl.
CPC .......... *G11C 11/419* (2013.01); *G11C 11/418* (2013.01); *G11C 7/1075* (2013.01); *H01L 27/11* (2013.01)

(58) Field of Classification Search
CPC .................................................. G11C 7/1075
USPC .................................................. 365/230.03
See application file for complete search history.

(56) References Cited

U.S. PATENT DOCUMENTS

2011/0188335 A1*   8/2011   Roy ...................... G11C 11/413
                                                                                365/230.03

* cited by examiner

*Primary Examiner* — Jason Lappas
(74) *Attorney, Agent, or Firm* — Pramudji Law Group PLLC; Ari Pramudji

(57) ABSTRACT

Various implementations described herein are directed to an integrated circuit having multiple bitcell arrays and multiple input ports including a single write input port for the multiple bitcell arrays and multiple read input ports for the multiple bitcell arrays. The integrated circuit may include multiple read output ports for the multiple bitcell arrays. The single write input port is used for writing data to the multiple bitcell arrays, and the multiple read input ports are used separately for reading data from the multiple bitcell arrays for output to the multiple read output ports.

14 Claims, 6 Drawing Sheets

MULTI-PORT MEMORY CIRCUITRY

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In advanced processing cores, there is a need for 3-port memories having one dedicated write-port and two dedicated read-ports. Foundries do not supply these special 3-port memories, and therefore, implementing 3-port memories can be difficult. Foundries are typically only capable of supplying 1-port or 2-port memories. As such, there is need to improve conventional processing core designs by providing 3-port memories without sacrificing power, performance and area (PPA).

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to and are directed to multi-port memory circuitry including schemes and techniques for merging multiple bitcell arrays in various multi-port memory applications. For instance, various implementations described herein refer to re-using existing 2-port memory developed with foundry bitcells, wherein two foundry bitcell memories may be used to build one advanced memory device. In this instance, the logic related to the write port does not need to be duplicated. Also, common logic such as power-gating circuitry may not need to be duplicated. Therefore, during a write operation, the same input data may be written to both the 2-port memories internally, and the read operation may be separate and activated depending the two read ports. In another instance, an advanced (or custom) bitcell memory device may be designed that uses a single write port and two or more read ports. In this instance, the advanced bitcell memory device may consume less area and thus be more efficient in reference to power and performance than re-using multiple separate bit cell memory devices.

Various implementations of multi-port memory circuitry will be described in detail herein with reference to FIGS. 1-4.

Figure 1:
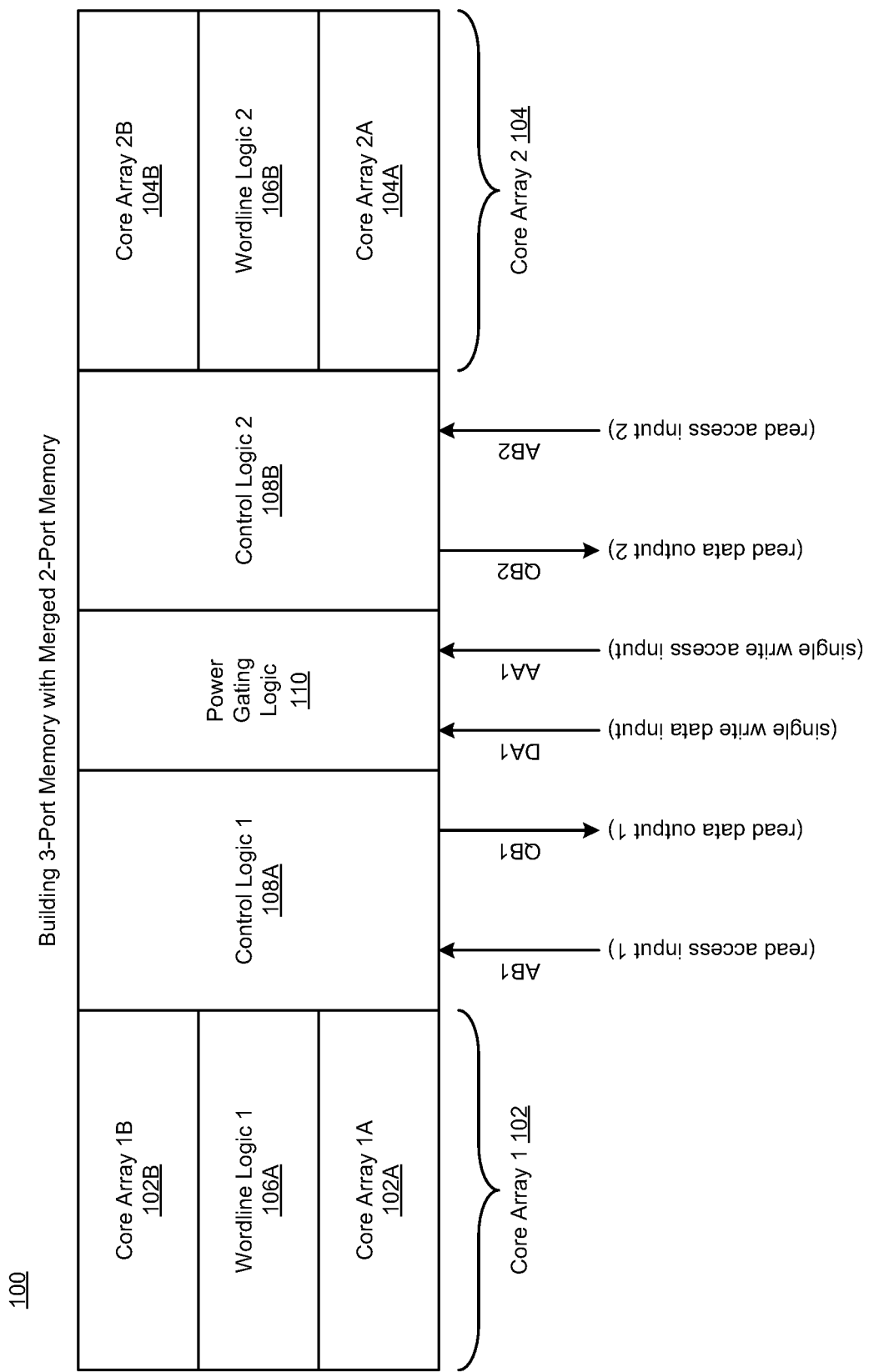
FIG. 1 illustrates a block diagram of multi-port memory circuitry in accordance with various implementations described herein.

FIG. 1 illustrates a diagram of multi-port memory circuitry 100 in accordance with various implementations described herein. In some implementations, as described herein, the schemes and techniques described herein refer to building multi-port memory (e.g., 3-port memory) by merging dual-port memory instances. Further description related to the memory circuitry 100 and various components associated therewith are described in greater detail herein below.

As shown in FIG. 1, the memory circuitry 100 includes various components including, e.g., core array circuitry 102 and 104, wordline logic 106A and 106B, control logic 108A and 108B, and power gating logic 110. The memory circuitry 100 may be implemented as an integrated circuit (IC) in various types of memory devices and applications, such as, e.g., random access memory (RAM), including static RAM (SRAM), and/or any other types of volatile memory. In some instances, the memory circuitry 100 may be implemented as an IC with dual rail memory architecture and related circuitry. In other instances, the memory circuitry 100 may be integrated with computing circuitry and related components on a single chip. Also, the memory circuitry 100 may be implemented in an embedded system for various electronic, mobile, automobile, and Internet-of-Things (IoT) applications.

Referring to diagram of FIG. 1, the memory circuitry 100 may include the core circuitry 102 (i.e., core array 1) and 104 (i.e., core array 2) having multiple banks of bitcell arrays 102A (i.e., core array 1A), 102B (i.e., core array 1B), 104A (i.e., core array 2A), 104B (i.e., core array 2B) that may be arranged in columns and rows. Also, the memory circuitry 100 may include the control logic 108A and 108B and the wordline logic 106A and 106B for accessing each of bitcells in the banks of bitcell arrays 102A, 102B, 104A, 104B via a selected wordline (WL) and one or more selected bitlines (BL). Further, the power gating logic 110 may assist with storing data in the bitcells arrays 102 and 104. Thus, the core circuitry 102 and 104 may include one or more bitcell arrays (i.e., banks of bitcell arrays 102A, 102B, 104A, 104B) that are accessible via at least one wordline (WL) and one or more bitlines (BL). The core circuitry 102 and 104 and various components thereof may operate at a source voltage supply, such as, e.g., a core supply voltage Vdd along with ground or negative (−) voltage supply Vss. In other instances, the voltage range may vary with technology.

The core array circuitry 102 and 104 may include multiple banks of memory cell arrays (102A, 102B, 104A, 104B), wherein each bitcell may be referred to as a memory cell or data storage cell. Further, each bit cell may be configured to store at least one data bit value (e.g., a data value related to a logical '0' or '1'). In various instances, the arrays of bitcells 102 and 104 may include any number of bitcells that are arranged in various applicable configurations, such as, e.g., a two-dimensional (2D) memory array having any number of columns (Ncolumns) and any number of rows (Nrows) of multiple memory cells arranged in a 2D grid pattern with 2D indexing capabilities.

In some cases, each bitcell may be implemented with random access memory (RAM) circuitry, or some other type of volatile type memory. For instance, each memory cell (or bitcell) may include various multi-transistor static RAM (SRAM) cells, including various types of SRAM cells, such as, e.g., 6T CMOS SRAM and/or various other types of complementary MOS (CMOS) SRAM cells, such as, e.g., 2T, 4T, 8T, 10T, 12T, 14T or more transistors per bit. Further, in some cases, the memory circuitry 100 may operate at one or more source voltage levels (Vdd, Vss, etc.) with a voltage range that varies with the applicable technology for specific integrated circuits (ICs).

Along with the multiple bitcell arrays 102 (102A, 102B) and 104 (104A, 104B), the memory circuitry 100 may include addressing ports for accessing (via write and read operations) data stored in the multiple bitcell arrays 102 and 104. The multiple bitcell arrays 102, 104 may include a first bitcell array 102 and a second bitcell array 104. The data stored in the first bitcell array 102 may include first data, and the data stored in the second bitcell array 194 may include second data.

As such, the memory circuitry 100 may include multiple input ports including a single write input port (AA1) for the multiple bitcell arrays 102, 104 and multiple read input ports (AB1, AB2) for the multiple bitcell arrays 102, 104. The single write input port (AA1) may be referred to as a single write access port. The multiple read input ports (AB1, AB2) may include a first read input port (AB1, i.e., read access port 1) and a second read input port (AB2, i.e., read access port 2). The first read input port (AB1) may be used for reading the first data from the first bitcell array 102 based on a first address received via the first read input port (AB1). The second read input port (AB2) may be used for reading the second data from the second bitcell array 104 based on a second address received via the second read input port (AB2).

The memory circuitry 100 may include multiple read output ports (QB1, QB2) for the multiple bitcell arrays 102, 104. The multiple read output ports (QB1, QB2) may include a first read output port (QB1, i.e., read data output 1) and a second read output port (QB2, i.e., read data output 2). The first data may be output to the first read output port (QB1) from the first bitcell array 102, and the second data may be output to the second read output port (QB2) from the second bitcell array 104.

The single write input port (AA1) may be used for writing data to the multiple bitcell arrays 102, 104, and the multiple read input ports (AB1, AB2) may be used separately for reading data from the multiple bitcell arrays 102, 104 for output to the multiple read output ports (QB1, QB2). The single write input port (AA1) may be used for writing the data to the first bitcell array 102 based on a first address and/or to the second bitcell array 104 based on a second address. The first address and the second address may be received by the single write input port (AA1). The single write input port (AA1) may receive the first address that is used for writing the data to the first bitcell array 102 as the first data, and the single write input port (AA1) may receive the second address that is used for writing the data to the second bitcell array 104 as the second data.

The memory circuitry 100 may include a single write data input port (DA1) that receives the data for writing to the first bitcell array 102 as the first data based on a first address or for writing to the second bitcell array 104 as the second data based on a second address. In this instance, the first address and the second address are received from the single write input port (AA1).

In some instances, the memory circuitry 100 may be implemented as a multi-port memory device having the single write input port (AA1) and the multiple read input ports (AB1, AB2) including two or more read input ports. In other instances, the memory circuitry 100 may be implemented as a three-port (3-port) memory device having the single write input port (AA1) and the multiple read input ports (AB1, AB2) including the first read input port (AB1) and the second read input port (AB2).

Figure 2A:
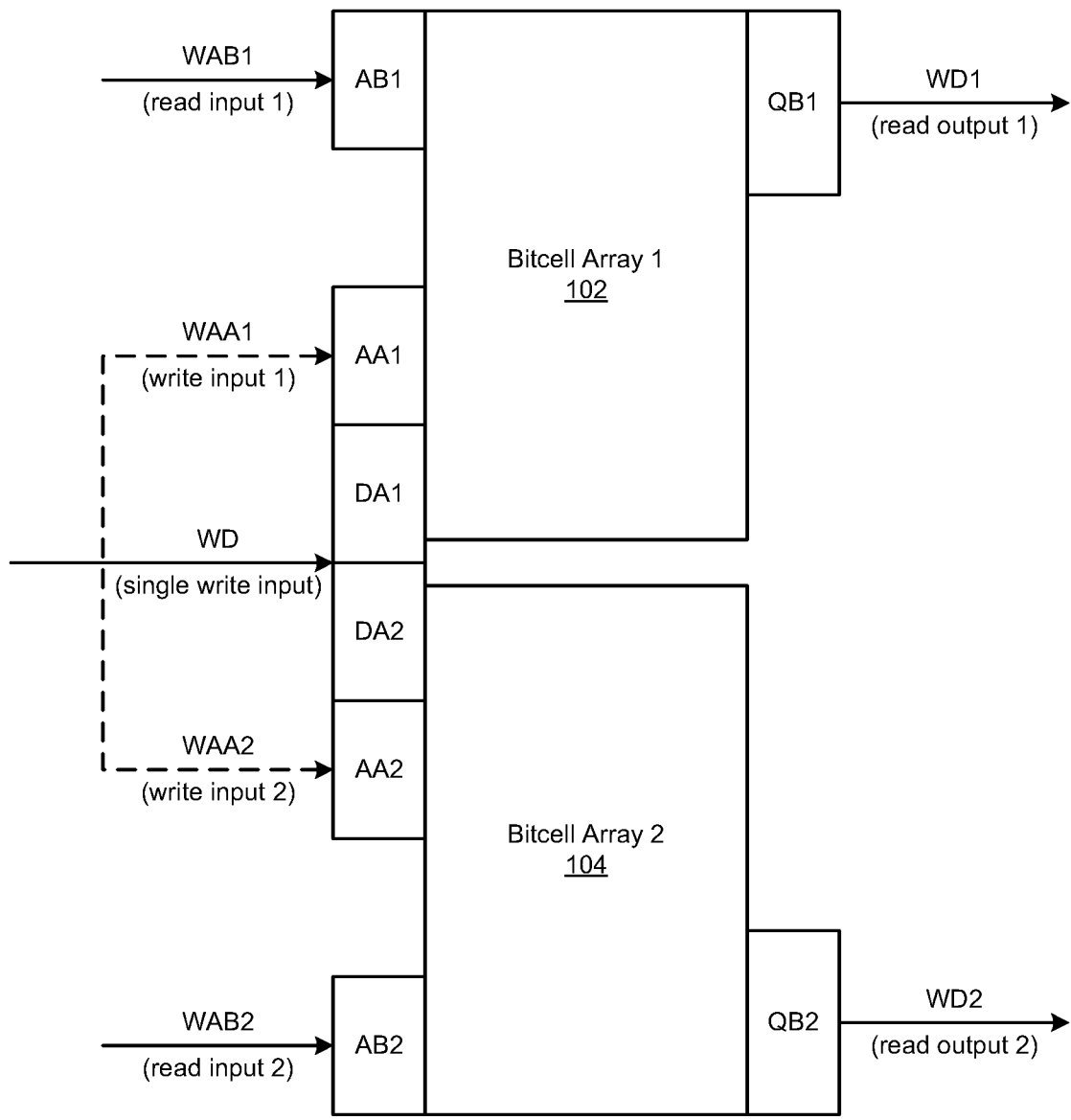
FIGS. 2A, 2B and 2C illustrate various diagrams of multi-port memory circuitry in accordance with various implementations described herein.
Figure 2B:
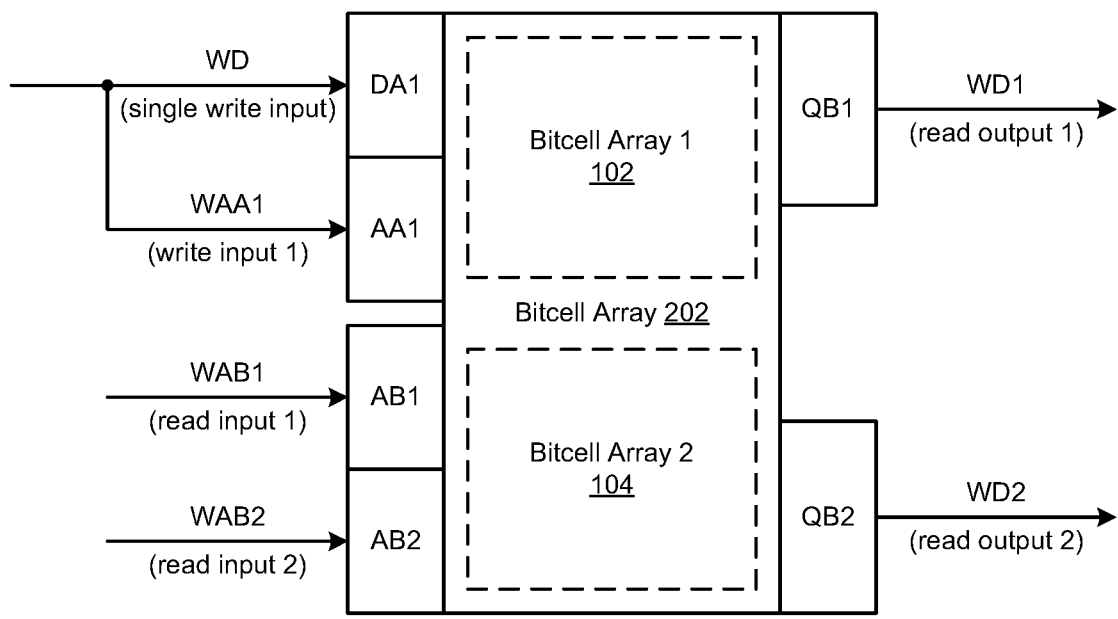
Figure 2C:
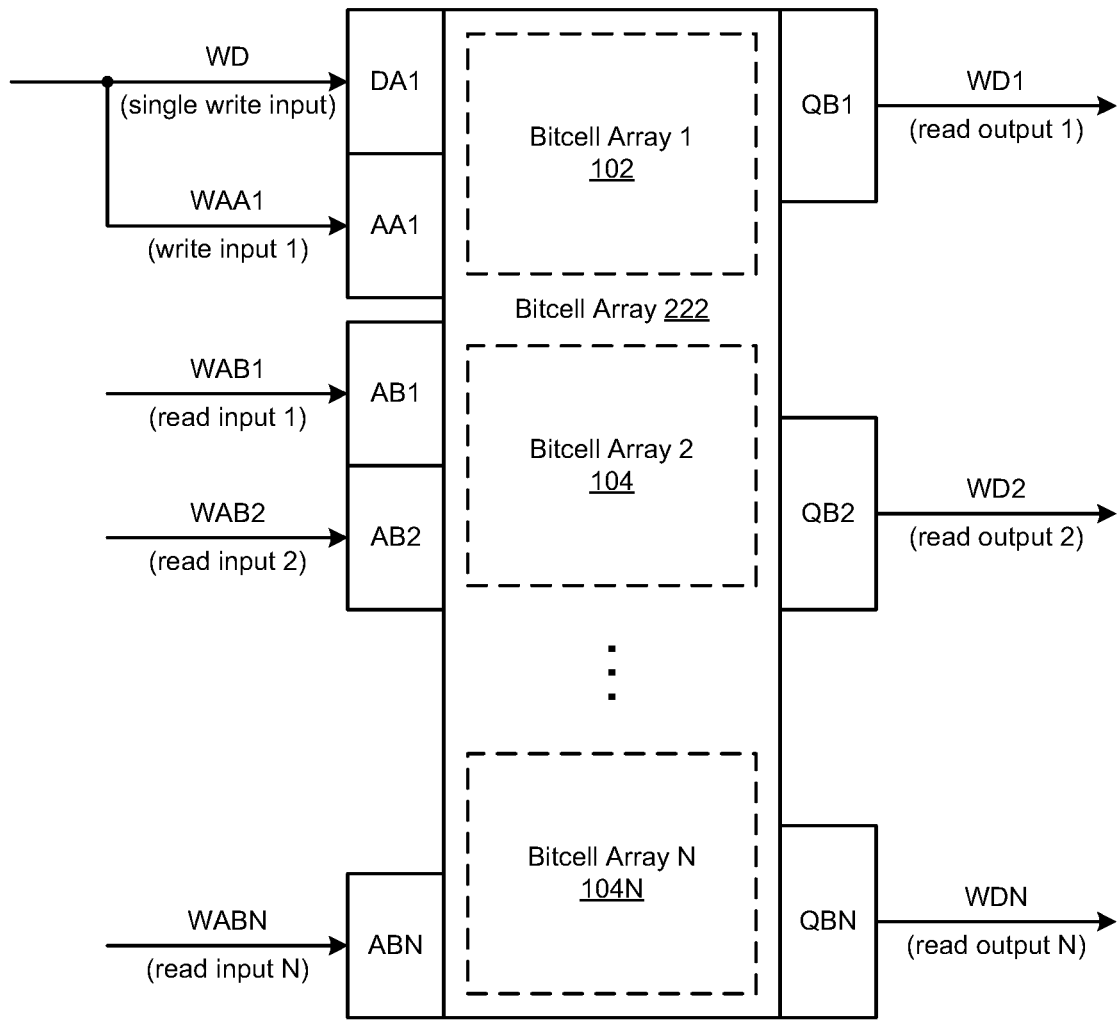

FIGS. 2A, 2B and 2C illustrate various diagrams of multi-port memory circuitry in accordance with implementations described herein. In particular, FIG. 2A illustrates a diagram of multi-port memory circuitry 200A, FIG. 2B illustrates another diagram of multi-port memory circuitry 200B, and FIG. 2C illustrates still another diagram of multi-port memory circuitry 200C. In reference to FIGS. 2A, 2B and 2C, various components described therein are similar in scope and functionality to related components as shown and described in reference to FIG. 1.

As shown in FIG. 2A, the multi-port memory circuitry 200A includes multiple bitcell arrays 102, 104 including the first bitcell array 102 and the second bitcell array 104, which is separate from the first bitcell array 102. In various instances, each bitcell in the multiple bitcell arrays 102 and 104 may be implemented with a memory storage cell that has a single write port and a single read port (2-port bitcell with 1 write port and 1 read port). The circuitry 200A includes multiple input ports including a single write input port (WD), a first read input port (WAB1), and a second read input port (WAB2). For instance, the circuitry 200A may be implemented as a 3-port memory device having 2 merged (2×) memory devices with each memory device having 1 read (1R) and 1 write (1W), wherein the circuitry 200A may be referred to as a merged 2×1R1W.

The single write input port (WD) implements merging of multiple write input ports, such as, e.g., a first write input port (WAA1, i.e., first write input AA1) for the first bitcell array 102 and a second write input port (WAA2, i.e., second write input AA2) for the second bitcell array 104. The single write input port (WD) implements merging of multiple write data input ports, such as, e.g., a write data input (DA1) for the first bitcell array 102 and a write data input (DA2) for the second bitcell array 104. Further, the circuitry 200A may include multiple read output ports including a first read output port (WD1, i.e., first read output QB1) and a second read output port (WD2, i.e., second read output QB2). As such, in the shown implementation of FIG. 2A, the first bitcell or core array 102 is separate from the second bitcell or core array 104, and the separate arrays 102 and 104 share the merged write input port (WD), and also, each bitcell array 102 and 104 has separate read input ports, such as, e.g., the read input port (WAB1) for the first bitcell array 102, and the read input port (WAB2) for the second bitcell array 104.

In some instances, the single write input port (WD) may be used for writing data to the first bitcell array 102 as first data and for writing to the second bitcell array 104 as second data. The first read input port (WAB1, i.e., first read input AB1) may be used for reading the first data from the first bitcell array 102 for output to the first read output port (WD1, i.e., first read output QB1). The second read input port (WAB2, i.e., second read input AB2) may be used for reading the second data from the second bitcell array 104 for output to the second output port (WD2, i.e., second read output QB2). The first read input port (WAB1) of the first bitcell array 102 corresponds to the first read output port (WD1) of the first bitcell array 102, and the second read input port (WAB2) of the second bitcell array 104 corresponds to the second read output port (WD2).

In some implementations, the multi-port memory circuitry 200A may include the single write data input port (WD) that may be used to receive the data for writing to the first bitcell array 102 as the first data based on a first address AA1 (e.g., as received at the first write input WAA1) or for writing to the second bitcell array 104 as the second data based on a second address AA2 (e.g., as received at the second write input WAA2). In some instances, the first address (AA1) and the second address (AA2) may be received by the single write input port (WD). As such, the multi-port memory circuitry 200A may be implemented as a multi-port memory device having the single write input port (WD) and at least two read input ports including the first read input port (WAB1) and the second read input port (WAB2). For instance, as shown in FIG. 2A, the circuitry 200A may be a 3-port memory device having the single write input port (WD), the first read input port (WAB1), and the second read input port (WAB2).

In some implementations, during operation, 3 sets of bitcells (3 data words) may be simultaneously accessible with separate addresses via multiple input ports. Sets of bitcells are separately accessible with an address. Also, 1 write operation and 2 read operations may be performed simultaneously using the addresses (3 sets of addresses, 1 write address and 2 read addresses, same address or different addresses). In some instances, addressing may be performed on many bitcells, wherein each address refers to many bitcells, and wherein 1 write and 2 reads may be performed at the same time. In other instances, each address may be disposed in a word of bitcells, such as, e.g., mux2 or mux4, 2 words for mux2, 4 words for mux4, wherein each address is only 1 word.

FIG. 2B illustrates the multi-port memory circuitry 200B, which is similar to the implementation of circuitry 200A in FIG. 2A, except that the two separate bitcell arrays 102 and 104 have been integrated into a single bitcell array 202 with bitcell arrays 102 and 104 implemented as multiple banks of bitcell arrays. In some instances, the multi-port memory circuitry 200B of FIG. 2B may be referred to as an advanced multi-port memory device having, e.g., 3 or more ports.

As shown in FIG. 2B, the multi-port memory circuitry 200B includes multiple bitcell arrays 102, 104 including the first bitcell array 102 and the second bitcell array 104, which is separate from the first bitcell array 102. In various instances, each bitcell in the multiple bitcell arrays 102 and 104 may be implemented with a memory storage cell that has a single write port and a single read port (2-port bitcell with 1 write port and 1 read port). The circuitry 200B includes multiple input ports including the single write input port (WD), the first read input port (WAB1), and the second read input port (WAB2). As shown, the circuitry 200B may be implemented as a 3-port memory device having 2 read (2R) and 1 write (1W), wherein the circuitry 200B may be referred to as a 2R1W.

In reference to FIG. 2B, various components described therein are similar in scope and functionality to related components as shown and described in reference to FIG. 2A. For instance, the multi-port memory circuitry 200B may include the single write data input port (WD) that may be used to receive the data for writing to the first bitcell array 102 as the data based on the address AA1 (e.g., as received at the write input WAA1) or for writing to the second bitcell array 104 as the data also based on the address AA1 (e.g., as also received at the write input WAA1). In some instances, the address (AA1) may be received as part of the single write input port (WD). Also, the multi-port memory circuitry 200B may be implemented as a multi-port memory device having the single write input port (WD) and at least two read input ports including, e.g., the first read input port (WAB1) and the second read input port (WAB2). For instance, as shown in FIG. 2B, the circuitry 200B may be a 3-port memory device having the single write input port (WD), the first read input port (WAB1), and the second read input port (WAB2). However, as shown in FIG. 2C, memory circuitry may be modified to have any number of read input ports, such as, e.g., three or more.

FIG. 2C illustrates the multi-port memory circuitry 200C, which is similar to the implementation of circuitry 200B in FIG. 2B, except that the single bitcell array 222 may be integrated with any number of bitcell arrays 102, 104, . . . , 104N by implementing them as multiple banks of bitcell arrays. Thus, in various instances, the multi-port memory circuitry 200C of FIG. 2C may be referred to as another advanced multi-port multi-bank memory device having, e.g., any number (N) of bitcell arrays and ports.

As shown in FIG. 2C, the multi-port memory circuitry 200C includes multiple bitcell arrays 102, 104, . . . , 104N including any number (N) of bitcell arrays. In various instances, each bitcell in each of the multiple bitcell arrays 102, 104, . . . , 104N may be implemented with a memory storage cell that has a single write port and a single read port (2-port bitcell with 1 write port and 1 read port). The circuitry 200C includes multiple input ports including the single write input port (WD) and any number (N) of read input ports (WAB1, WAB2, . . . , WABN). As shown, the circuitry 200C may be implemented as an N-port memory device having any number (N) of read (NR) and 1 write (1W), wherein the circuitry 200C may be referred to as a NR1W.

In reference to FIG. 2C, various components described therein are similar in scope and functionality to related components as shown and described in reference to FIGS. 2A and 2B. For instance, the multi-port memory circuitry 200C may include the single write data input port (WD) that may be used to receive the data for writing to the any bitcell array 102, 104, . . . , 104N as the data based on the address AA1 (e.g., as received at the write input WAA1). In some instances, the address (AA1) may be received as part of the single write input port (WD). Further, the multi-port memory circuitry 200C may be implemented as a multi-port memory device having the single write input port (WD) and and any number (N) of read input ports including, e.g., WAB1, WAB2, . . . , WABN. For instance, as shown in FIG. 2C, the circuitry 200C may be an N-port memory device having the single write input port (WD) and any number (N) of read input ports (WAB1, WAB2, . . . , WABN). Therefore, as shown in FIG. 2C, memory circuitry may be modified to have any number of read input ports, such as, e.g., three or more.

Figure 3:
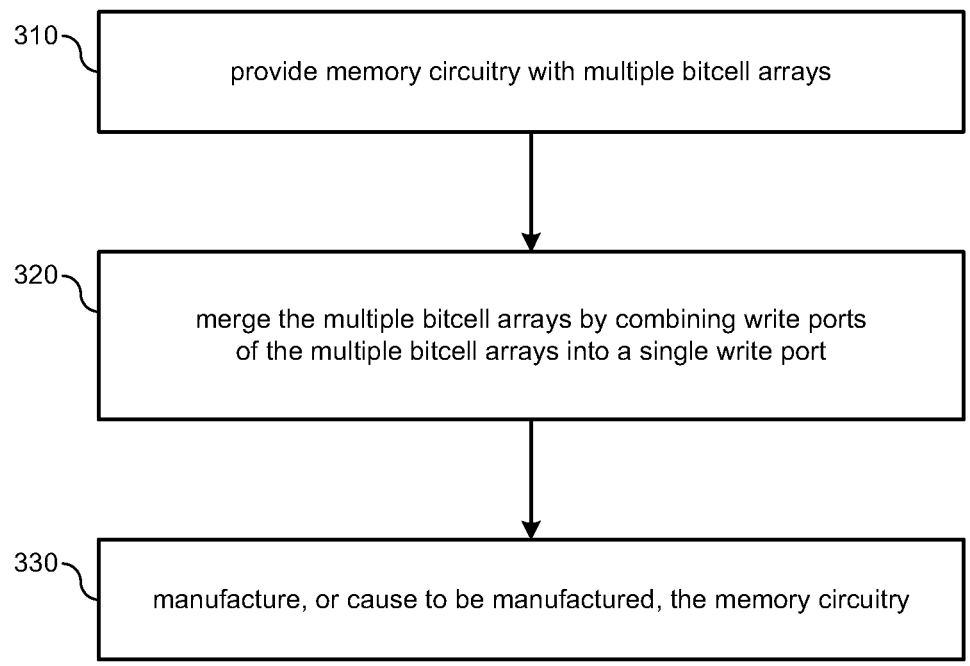
FIG. 3 illustrates a process diagram of a method for merging multiple bitcell arrays in accordance with various implementations described herein.

FIG. 3 illustrates a process flow diagram of a method 300 for merging multiple bitcell arrays in accordance with various implementations described herein.

It should be understood that even though method 300 may indicate a particular order of operation execution, in some cases, various specific portions of operations may be executed in a different order, and on different systems. Some additional operations and/or steps may be added to and/or omitted from method 300. Also, method 300 may be implemented in hardware and/or software. If implemented in hardware, method 300 may be implemented with various circuit elements, such as described herein above in reference to FIGS. 1-3. If implemented in software, method 300 may be implemented as a program or software instruction process that may be configured for merging multiple bitcell arrays as described herein above. Further, if implemented in software, instructions related to implementing the method 300 may be stored in memory and/or a database. For instance, a computer or various other types of computing devices having a processor and memory may be configured to perform method 300.

As described and shown in reference to FIG. 3, method 300 may be utilized for merging multiple bitcell arrays in various multi-port memory applications.

At block 310, method 300 may provide memory circuitry with multiple bitcell arrays. At block 320, method 300 may merge the multiple bitcell arrays by combining write ports of the multiple bitcell arrays into a single write port. At block 330, method 300 may manufacture, or cause to be manufactured, the memory circuitry having the merged the multiple bitcell arrays. In some implementations, the multiple bitcell arrays include two bitcell arrays, and merging the multiple bitcell arrays includes combining the write ports of the two bitcell arrays into the single write port, and each bitcell array of the two bitcell arrays includes a corresponding read port. As such, in some instances, the memory circuitry may be implemented as 3-port memory circuitry having the single write port and two corresponding read ports.

In various other instances, the multiple bitcell arrays may include three or more bitcell arrays, and in these instances, merging the multiple bitcell arrays may include combining the write ports of the three or more bitcell arrays into the single write port, and each bitcell array of the three or more bitcell arrays may include a corresponding read port. Hence, the memory circuitry may be implemented as multi-port memory circuitry having the single write port and three or more corresponding read ports.

Figure 4:
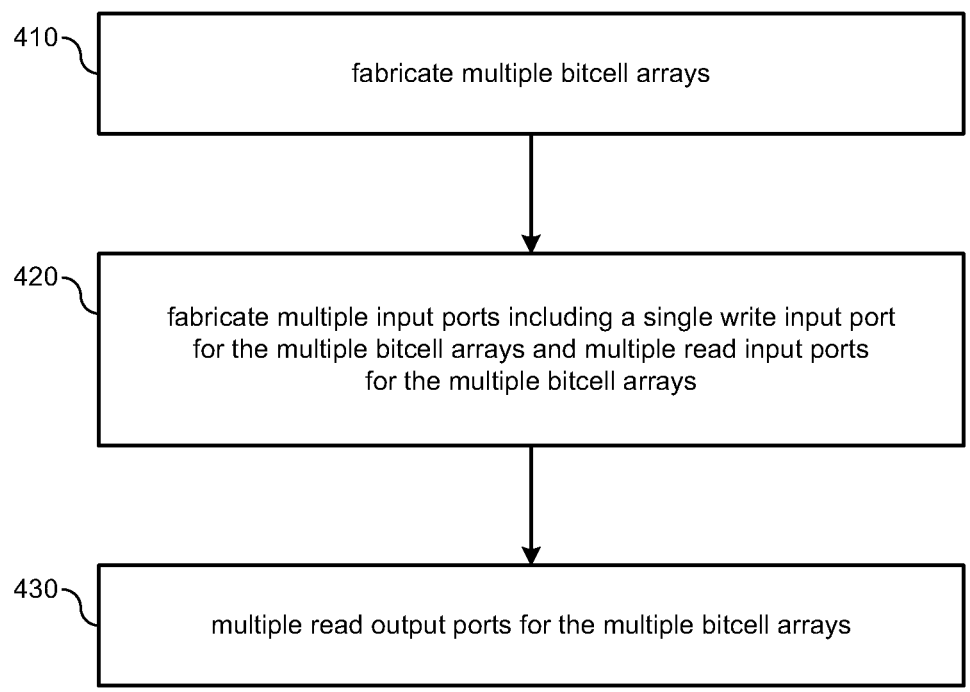
FIG. 4 illustrates a process diagram of a method for fabricating an integrated circuit in accordance with various implementations described herein.

FIG. 4 illustrates a process flow diagram of a method 400 for fabricating an integrated circuit in accordance with various implementations described herein.

It should be understood that even though method 400 may indicate a particular order of operation execution, in some cases, various specific portions of operations may be executed in a different order, and on different systems. Some additional operations and/or steps may be added to and/or omitted from method 400. Also, method 400 may be implemented in hardware and/or software. If implemented in hardware, method 400 may be implemented with various circuit elements, such as described herein above in reference to FIGS. 1-3. If implemented in software, method 400 may be implemented as a program or software instruction process that may be configured for providing multi-port memory circuitry as described herein above. Further, if implemented in software, instructions related to implementing the method 400 may be stored in memory and/or a database. For instance, a computer or various other types of computing devices having a processor and memory may be configured to perform method 400.

As described and shown in reference to FIG. 4, method 400 may be utilized for manufacturing, fabricating, and/or producing an integrated circuit (IC) that implements multi-port memory circuitry. In various implementations, the integrated circuit (IC) may be implemented as a multi-port memory device having two or three or more ports.

At block 410, method 400 may fabricate multiple bitcell arrays, and each bitcell array may include an array of multiple bitcells. In various implementations, bitcells in the each array of bitcells may include various types of memory storage cells, such as, various types of random access memory (RAM), including, e.g., static RAM (SRAM). The multiple bitcell arrays may include a first bitcell array and a second bitcell array, and data stored in the first bitcell array may include first data, and data stored in the second bitcell array may include second data. In other instances, the multiple bitcell arrays may include three of more bitcell arrays.

At block 420, method 400 may fabricate multiple input ports including a single write input port for the multiple bitcell arrays and multiple read input ports for the multiple bitcell arrays. The single write input port may be used for writing the data to the first bitcell array based on a first address or to the second bitcell array based on a second address, and the first address and the second address may be received by the single write input port. The single write input port may receive the first address that is used for writing the data to the first bitcell array as the first data, and the single write input port may also receive the second address that is used for writing the data to the second bitcell array as the second data. The multiple read input ports may include a first read input port and a second read input port, and the first read input port may be used for reading the first data from the first bitcell array based on a first address received via the first read input port, and the second read input port may be used for reading the second data from the second bitcell array based on a second address received via the second read input port.

At block 430, method 400 may fabricate multiple read output ports for the multiple bitcell arrays. In some implementations, the single write input port may be used for writing data to the multiple bitcell arrays, and the multiple read input ports may be used separately for reading data from the multiple bitcell arrays for output to the multiple read output ports. The multiple read output ports may include a first read output port and a second read output port, and the first data is output to the first read output port from the first bitcell array, and the second data is output to the second read output port from the second bitcell array.

In some implementations, method 400 may further include fabricating a single write data input port that receives the data for writing to the first bitcell array as first data based on a first address or writing to the second bitcell array as second data based on a second address. In this instance, the first address and the second address are received from the single write input port. Further, in some instances, the integrated circuit may be implemented as a 3-port memory device having the single write input port and the multiple read input ports including a first read input port and a second read input port. In various other instances, the integrated circuit may be implemented as a multi-port memory device (e.g., three of more port memory device) having the single write input port and the multiple read input ports including two or more read input ports.

Described herein are various implementations of an integrated circuit. The integrated circuit may include multiple bitcell arrays and multiple input ports including a single write input port for the multiple bitcell arrays and multiple read input ports for the multiple bitcell arrays. The integrated circuit may include multiple read output ports for the multiple bitcell arrays, wherein the single write input port is used for writing data to the multiple bitcell arrays, and wherein the multiple read input ports are used separately for reading data from the multiple bitcell arrays for output to the multiple read output ports.

Described herein are various implementations of an integrated circuit. The integrated circuit may include multiple bitcell arrays including a first bitcell array and a second bitcell array. The integrated circuit may include multiple input ports including a single write input port, a first read input port, and a second read input port. The integrated circuit may include multiple read output ports having a first read output port and a second read output port. The single write input port may be used for writing data to the first bitcell array as first data and writing to the second bitcell array as second data. The first read input port may be used for reading the first data from the first bitcell array for output to the first read output port. The second read input port may be used for reading the second data from the second bitcell array for output to the second output port.

Described herein are various implementations of a method for manufacturing or fabricating memory circuitry. The method may include providing memory circuitry with multiple bitcell arrays. The method may include merging the multiple bitcell arrays by combining write ports of the multiple bitcell arrays into a single write port. The method may include manufacturing, or causing to be manufactured, the memory circuitry.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   multiple bitcell arrays including a first bitcell array and a second bitcell array that is separate from the first bitcell array, wherein each bitcell in the multiple bitcell arrays has a single write port and a single read port;
   multiple input ports including a single write input port for the multiple bitcell arrays and multiple read input ports for the multiple bitcell arrays; and
   multiple read output ports for the multiple bitcell arrays, wherein the single write input port is used for writing data to the first bitcell array or the second bitcell array, and wherein the multiple read input ports have a first read input port used for reading data from the first bitcell array and a second read input port used for reading data from the second bitcell array.

2. The integrated circuit of claim 1, wherein the data stored in the first bitcell array comprises first data, and wherein the data stored in the second bitcell array comprises second data.

3. The integrated circuit of claim 2, wherein the single write input port is used for writing the data to the first bitcell array based on a first address or to the second bitcell array based on a second address, wherein the first address and the second address are received by the single write input port.

4. The integrated circuit of claim 3, wherein the single write input port receives the first address that is used for writing the data to the first bitcell array as the first data, and wherein the single write input port receives the second address that is used for writing the data to the second bitcell array as the second data.

5. The integrated circuit of claim 2, wherein the first read input port is used for reading the first data from the first bitcell array based on a first address received via the first read input port, and wherein the second read input port is used for reading the second data from the second bitcell array based on a second address received via the second read input port.

6. The integrated circuit of claim 5, wherein the multiple read output ports comprise a first read output port and a second read output port, and wherein the first data is output to the first read output port from the first bitcell array, and wherein the second data is output to the second read output port from the second bitcell array.

7. The integrated circuit of claim 1, further comprising a single write data input port that receives the data for writing to the first bitcell array as first data based on a first address or writing to the second bitcell array as second data based on a second address, wherein the first address and the second address are received from the single write input port.

8. The integrated circuit of claim 1, wherein the integrated circuit comprises a multi-port memory device having the single write input port and the multiple read input ports including two or more read input ports.

9. The integrated circuit of claim 1, wherein the integrated circuit comprises a 3-port memory device having the single write input port and the multiple read input ports including a first read input port and a second read input port.

10. A method, comprising:
providing memory circuitry with multiple bitcell arrays including a first bitcell array and a second bitcell array separate from the first bitcell array, wherein each bitcell in the multiple bitcell arrays has a write port and a read port;
merging the multiple bitcell arrays by combining the write ports of each bitcell in the multiple bitcell arrays into a single write port;
writing data to at least one of the multiple bitcell arrays including the first bitcell array or the second bitcell array with the single write input port;
designating a separate read input port to communicate with the read port of each bitcell array of the multiple bitcell arrays; and
manufacturing, or causing to be manufactured, the memory circuitry.

11. The method of claim 10, wherein the multiple bitcell arrays comprise two bitcell arrays, and wherein merging the multiple bitcell arrays includes combining the write ports of the two bitcell arrays into the single write port, and wherein each bitcell array of the two bitcell arrays includes a corresponding read port.

12. The method of claim 10, wherein the memory circuitry comprises 3-port memory circuitry having the single write port and two corresponding read ports.

13. The method of claim 10, wherein the multiple bitcell arrays comprise three or more bitcell arrays, and wherein merging the multiple bitcell arrays includes combining the write ports of the three or more bitcell arrays into the single write port, and wherein each bitcell array of the three or more bitcell arrays includes a corresponding read port.

14. The method of claim 10, wherein the memory circuitry comprises multi-port memory circuitry having the single write port and three or more corresponding read ports.

* * * * *